United States Patent [19]
Kubota

[11] Patent Number: 6,087,899
[45] Date of Patent: Jul. 11, 2000

[54] OPTICAL TRANSMITTER MODULE, AND SEMICONDUCTOR INTEGRATED CIRCUIT CAPABLE OF INCREASING GAIN AND BAND OF AMPLIFIER CONSTRUCTED FROM FET

[75] Inventor: Miki Kubota, Kawasaki, Japan

[73] Assignee: Fujitsu Limited, Kanagawa, Japan

[21] Appl. No.: 08/979,477

[22] Filed: Nov. 26, 1997

[30] Foreign Application Priority Data

Nov. 28, 1996 [JP] Japan ..................................... 8-317483

[51] Int. Cl.[7] ................................ H03F 3/45; H04B 10/04
[52] U.S. Cl. ........................... 330/253; 330/254; 359/180
[58] Field of Search .................................. 330/252, 253, 330/254; 359/180; 327/359

[56] References Cited

U.S. PATENT DOCUMENTS

| | | | |
|---|---|---|---|
| 5,586,146 | 12/1996 | Fang et al. | 330/254 |
| 5,630,228 | 5/1997 | Mittel | 327/359 |
| 5,877,643 | 5/1999 | Drogi | 327/359 |
| 6,023,192 | 2/2000 | Didier | 330/254 |

Primary Examiner—Robert Pascal
Assistant Examiner—Patricia T. Nguyen
Attorney, Agent, or Firm—Arent Fox Kintner Plotkin & Kahn, PLLC

[57] ABSTRACT

A semiconductor integrated circuit has a first load device and a first switching device connected in series between a first power supply line and a second power supply line, and an input signal is supplied to the control terminal of the first switching device. The semiconductor integrated circuit has a first switch unit and a first load unit. The first switch unit is connected between the first load device and the first power supply line, and is supplied with a first control signal at its control terminal. The first load unit is connected to the control terminal of the first switch unit, and its impedance is set at or varied to an arbitrary value. The band, gain, and output voltage of the circuit are controlled by the first control signal and the impedance of the first load unit. With this configuration, the gain and band (operating frequency band) of an amplifier constructed from an FET can be increased.

34 Claims, 13 Drawing Sheets

OPTICAL TRANSMITTER MODULE, AND SEMICONDUCTOR INTEGRATED CIRCUIT CAPABLE OF INCREASING GAIN AND BAND OF AMPLIFIER CONSTRUCTED FROM FET

BACKGROUND OF THE INVENTION

1. Field of the Invention

The present invention relates to a semiconductor integrated circuit and an optical transmitter module, and more particularly, to a semiconductor integrated circuit capable of increasing the gain and band of an amplifier constructed from a field-effect transistor (PET).

2. Description of the Related Art

Recently, driver ICs (semiconductor integrated circuits) used in optical transmitter modules are, for example, constructed by using GaAs FETs or the like. In such semiconductor integrated circuits, increasing amplifier gain and band (bandwidth: operating frequency band) is demanded.

In the prior art, a source-coupled FET logic (SCFL) circuit having load devices, switching FETs (for example, GaAs FETS), and constant current source 5, is employed. In the prior art SCFL circuit, when changing the duty ratio of an output voltage, it has been practiced to apply a DC bias, and control its bias level, to accomplish the change.

For example, variations in the duty ratio of the output voltage are caused by process variations during the manufacture of the semiconductor integrated circuit and variations in the ambient temperature where the semiconductor integrated circuit is actually used. In the prior art, the desired duty ratio is obtained by externally controlling the bias level. In this way, an external device (for example, a laser diode in an optical transmitter module) controlled by the semiconductor integrated circuit, for example, can be operated in optimum condition.

Therefore, in the prior art semiconductor integrated circuit, the desired duty ratio is obtained by externally controlling the bias level and thereby compensating for the variation of the duty ratio of the output voltage. In this semiconductor integrated circuit, inductor peaking is sometimes used to increase the band of the circuit, but providing an inductor within a semiconductor chip (IC) increases chip area and hence the cost. To avoid this, a DC bias is applied and its bias level is controlled to vary the duty (duty ratio). In this case, however, the gain of the differential amplifier is almost reduced by one-half compared with the case when complementary signals are applied as the differential input signals.

A prior art semiconductor integrated circuit and optical transmitter module, and a problem associated with the prior art, will be described in detail later with reference to the drawings,

SUMMARY OF THE INVENTION

An object of the present invention is to provide a semiconductor integrated circuit and an optical transmitter module which can increase the gain and band (operating frequency band) of an amplifier constructed from an FET.

An object of the present invention is to provide a semiconductor integrated circuit that is capable of reducing a skew among incoming signals as well as a skew among outgoing signals.

According to the present invention, there is provided a semiconductor integrated circuit having a first load device and a first switching device connected in series between a first power supply line and a second power supply line, a control terminal of the first switching device being supplied with an input signal, comprising a first switch unit connected between the first load device and the first power supply line, a control terminal of the first switch unit being supplied with a first control signal; and a first load unit connected to the control terminal of the first switch unit, an impedance of the first load unit being set at or varied to an arbitrary value, wherein a band, a gain, and an output voltage of the semiconductor integrated circuit are controlled by the first control signal and the impedance of the first load unit.

The first load unit may be a capacitor, and the load capacitor may be connected between the first power supply line and the control terminal of the first switch unit. The first load unit may be a resistor, and the load resistor may be connected between the first power supply line and the control terminal of the first switch unit. The first load unit may be a transistor having a control terminal supplied with a control signal, and the load transistor may be connected between the first power supply line and the control terminal of the first switch unit. The semiconductor integrated circuit may be a direct-coupled FET logic (DCFL) circuit, and an output signal may be taken from a node between the first load device and the first switching device.

The semiconductor integrated circuit may be a buffered FET logic (BFL) circuit, and the buffered FET logic circuit may further comprise a second switching device having a control terminal supplied with a signal taken from a node between the first load device and the first switching device; a level shift device connected to the second switching device; and a constant current source connected to the level shift device, wherein an output signal is taken from a node between the level shift device and the constant current source. The second switching device, the level shift device, and the constant current source may be connected in series between the first power supply line and the second power supply line. The level shift device may include at least one diode unit.

The semiconductor integrated circuit may be a source-coupled FET logic (SCFL) circuit, and the source-coupled FET logic circuit may further comprise a second switch unit, a second load device, and a second switching device, connected in series between the first power supply line and the second power supply line, and wherein a complementary input signal complementary to the input signal is supplied to the control terminal of the second switching device; a second control signal is supplied to the control terminal of the second switch unit, the control terminal of the second switch unit being coupled to a second load unit whose impedance is set at or varied to an arbitrary value; an output signal is taken from a node between the first load device and the first switching device; a complementary output signal complementary to the output signal is taken from a node between the second load device and the second switching device; and a band, a gain, and an output voltage of the semiconductor integrated circuit are controlled by the first and second control signals and the impedances of the first and second load units.

The first and second switching devices may be connected to the second power supply line via a constant current source. Each of the first and second load units may be a capacitor, and the first load capacitor may be connected between the first power supply line and the control terminal of the first switch unit, while the second load capacitor may be connected between the first power supply line and the control terminal of the second switch unit. Each of the first and second load units may be a resistor, and the first load resistor may be connected between the first power supply line and the control terminal of the first switch unit, while the second load resistor may be connected between the first power supply line and the control terminal of the second switch unit. Each of the first and second load units may be a transistor having a control terminal supplied with a control signal, and the first load transistor may be connected between the first power supply line and the control terminal of the first switch unit, while the second load transistor may be connected between the first power supply line and the control terminal of the second switch unit.

The first and second load units may be constructed together as one resistor. The first and second load units may be constructed together as one transistor having a control terminal supplied with a control signal.

Further, according to the present invention, there is provided a semiconductor integrated circuit comprising multiple stages of amplifier circuits, at least one of the amplifier circuits having a first load device and a first switching device connected in series between a first power supply line and a second power supply line, a control terminal of the first switching device being supplied with an input signal, wherein the at least one of the amplifier circuits comprises a first switch unit connected between the first load device and the first power supply line, a control terminal of the first switch unit being supplied with a first control signal; and a first load unit connected to the control terminal of the first switch unit, an impedance of the first load unit being set at or varied to an arbitrary value, wherein a band, a gain, and an output voltage of the semiconductor integrated circuit are controlled by the first control signal and the impedance of the first load unit.

According to the present invention, there is also provided an optical transmitter module comprising a driver integrated circuit for accepting input signals and for amplifying the input signals, a modulator block for accepting an output signal of the driver integrated circuit and for performing modulation using the output signal, a laser diode block for outputting laser light modulated in accordance with the output of the modulator block, and optics for coupling the laser light output from the laser diode block into an optical fiber, the driver integrated circuit comprising a first load device and a first switching device connected in series between a first power supply line and a second power supply line, a control terminal of the first switching device being supplied with an input signal, wherein the driver integrated circuit further comprises a first switch unit connected between the first load device and the first power supply line, the first switch unit having a control terminal supplied with a first control signal; and a first load unit connected to the control terminal of the first switch unit, an impedance of the first load unit being set at or varied to an arbitrary value, wherein a band, a gain, and an output voltage of the driver is integrated circuit are controlled by the first control signal and the impedance of the first load unit.

In addition, according to the present invention, there is also provided an optical transmitter module comprising a driver integrated circuit having multiple stages of amplifier circuits for accepting input signals and for amplifying the input signals, a modulator block for accepting an output signal of the driver integrated circuit and for performing modulation using the output signal, a laser diode block for outputting laser light modulated in accordance with the output of the modulator block, and optics for coupling the laser light output from the laser diode block into an optical fiber, at least one of the amplifier circuits having a first load device and a first switching device connected in series between a first power supply line and a second power supply line, a control terminal of the first switching device being supplied with an input signal, wherein the at least one of the amplifier circuits comprises a first switch unit connected between the first load device and the first power supply line, the first switch unit having a control terminal supplied with a first control signal; and a first load unit connected to the control terminal of the first switch unit, an impedance of the first load unit being set at or varied to an arbitrary value, wherein a band, a gain, and an output voltage of the driver integrated circuit are controlled by the first control signal and the impedance of the first load unit.

The at least one of the amplifier circuits may be at the first stage of the multiple stages of amplifier circuits.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

Before proceeding to the detailed description of the embodiments of the semiconductor integrated circuit and optical transmitter module of the present invention, the prior art semiconductor circuit and the problem associated with the prior art semiconductor circuit will be described first with reference to FIGS. 1 and 2 and FIGS. 3A to 3E.

Figure 1:
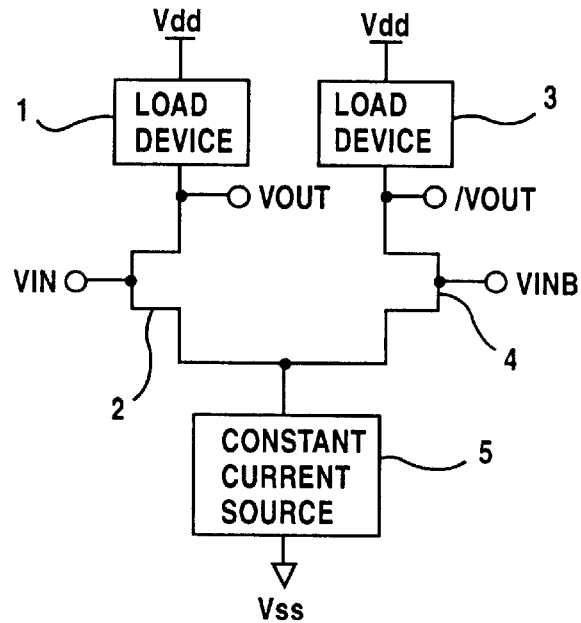
FIG. 1 is a circuit diagram showing one example of a prior art semiconductor integrated circuit.

FIG. 1 is a circuit diagram showing one example of the prior art semiconductor integrated circuit. Shown here is a basic gate of a source-coupled FET logic (SCFL) circuit. VIN and VINB are differential input signals (input voltages), and VOUT and /VOUT are complementary output signals (output voltages).

In FIG. 1, reference sign Vdd is a first power supply line for supplying a supply voltage, for example, of 0 volt, and Vss is a second power supply line for supplying a supply voltage, for example, of −5.2 volts. Further, reference numerals 1 and 3 are load devices, 2 and 4 are switching FETs, and 5 is a constant current source.

The SCFL circuit shown in FIG. 1, which comprises the load devices 1 and 3, switching FETs (for example, GaAs FETS) 2 and 4, and constant current source 5, is a commonly used, well known circuit.

Figure 2:
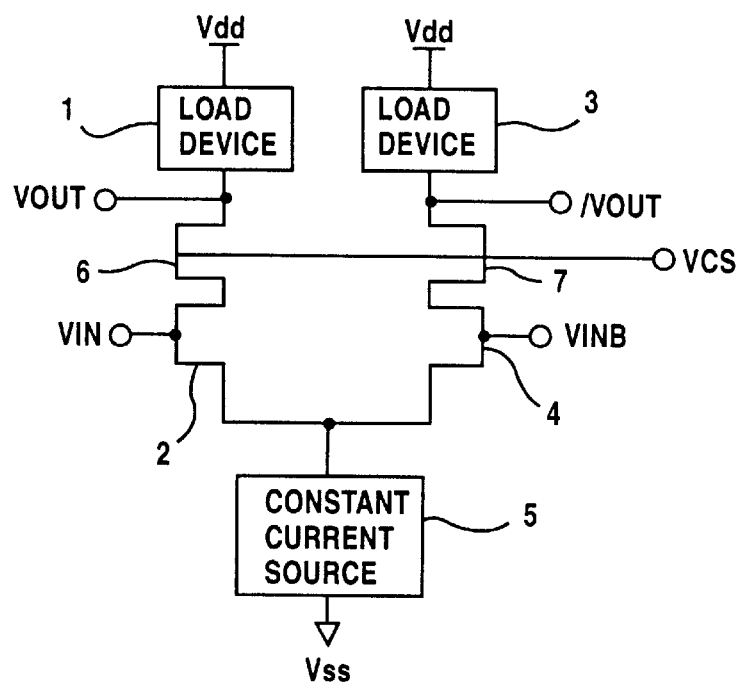
FIG. 2 is a circuit diagram showing another example of the prior art semiconductor integrated circuit.

FIG. 2 is a circuit diagram showing another example of the prior art semiconductor integrated circuit (SCFL circuit). As is apparent from the comparison with FIG. 1, the semiconductor integrated circuit shown in FIG. 2 includes an FET 6 inserted between the load device 1 and the switching FET 2 and an FET 7 inserted between the load device 3 and the switching FET 4, with a control signal VCS applied in common to the gates of the FETs 6 and 7.

There is no difference in SCFL circuit operation between the semiconductor integrated circuits shown in FIGS. 1 and 2; that is, in both circuits, an output voltage (VOUT) and its complementary output voltage (/VOUT) are obtained as a function of the potential difference between the first differential input signal VIN and the second differential input signal VINB. Here, in the circuit shown in FIG. 2, bias variations at the drains (connected to the first power supply line Vdd) of the switching FETs 2 and 4 are reduced compared with the circuit of FIG. 1, so that the increase in the gate-drain capacitance Cgd of the switching FETs 2 and 4 due to the Miller effect can be effectively suppressed. Accordingly, the circuit of FIG. 2 is capable of further increasing the band (bandwidth: operating frequency band), and hence capable of higher operating speed.

In the prior art semiconductor integrated circuits (SCFL circuits) shown in FIGS. 1 and 2, when changing the duty ratio (the ratio of the width of a high level "H" to the width of a low level "L" along the time axis) of the output voltage, it has been practiced to apply a DC voltage (DC bias) as the second differential input signal VINB, and control its bias level, to accomplish the change.

FIGS. 3A to 3E are waveform diagrams for explaining the operation of the prior art semiconductor integrated circuit, showing how the duty ratio of the output voltage VOUT (/VOUT) changes as a function of the voltage level (bias level) of the inverted input signal VINB.

Figures 3A, 3B, 3C, 3D, 3E:
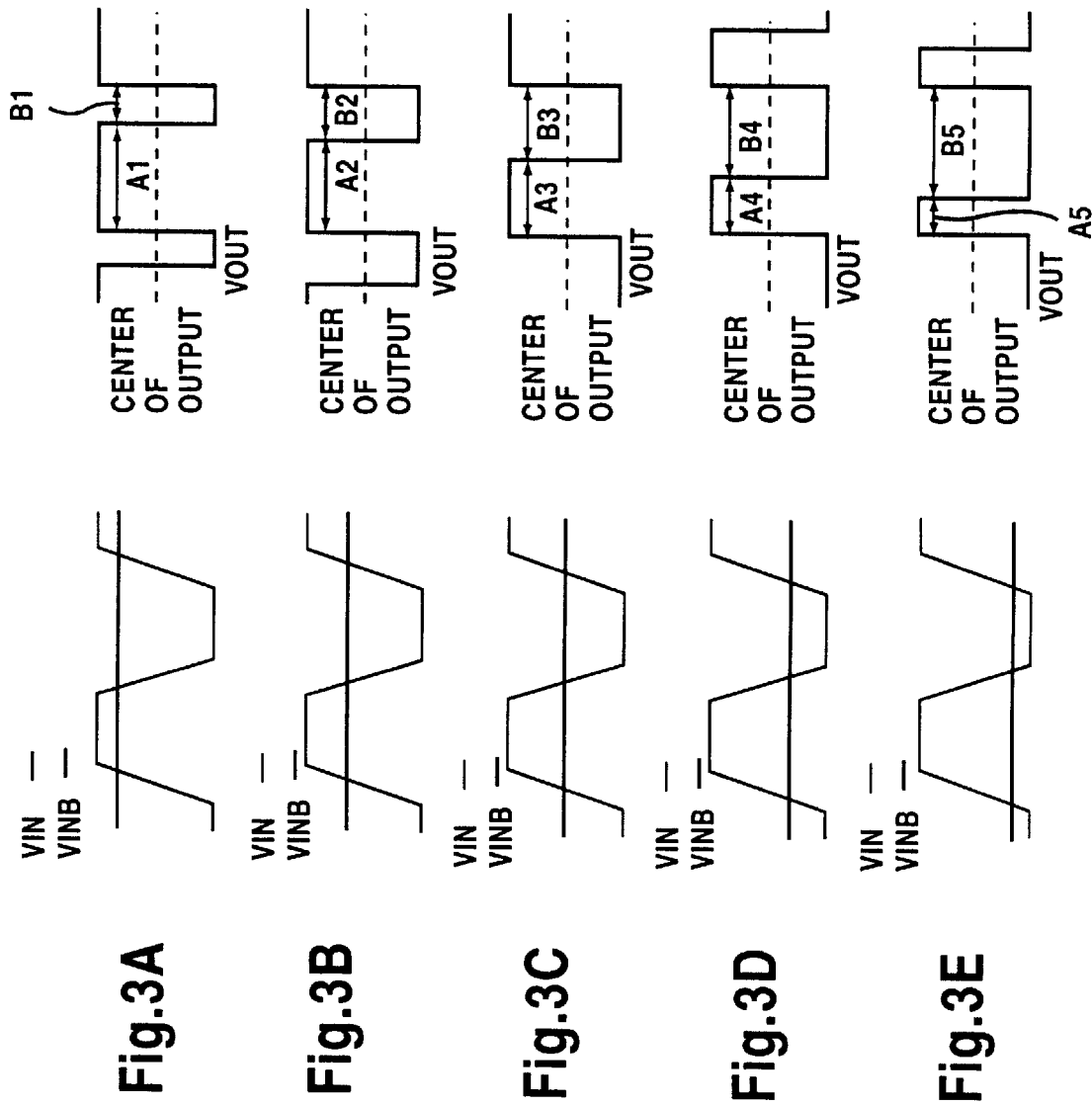
FIGS. 3A to 3E are waveform diagrams for explaining the operation of the prior art semiconductor integrated circuit.

As shown in FIGS. 3A to 3E, when the level of the DC voltage (DC bias) applied as the second differential input signal (the second differential input voltage) VINB is changed with respect to the first differential input signal (the first differential input voltage) VIN, the duty ratio of the output (VOUT) changes between A1/B1 and A5/B5. Here, FIG. 3A shows the case when the bias level (the second differential input voltage VINB) is the highest, FIG. 3B depicts the case when the bias level is slightly higher than an intermediate voltage (the voltage intermediate between the high level "H" and low level "L" of the first differential input signal VIN), and FIG. 3C concerns the case when the bias level is equal to the intermediate voltage. FIG. 3D displays the case when the bias level is slightly lower than the intermediate voltage, and FIG. 3E represents the case when the bias level is the lowest.

Variations in the duty ratio of the output voltage VOUT (/VOUT) are caused, for example, by process variations during the manufacture of the semiconductor integrated circuit and variations in the ambient temperature where the semiconductor integrated circuit is actually used. In the prior art, the desired duty ratio is obtained by externally controlling the bias level, as shown in FIGS. 3A to 3E. In this way, an external device (for example, a laser diode in an optical transmitter module) controlled by the semiconductor integrated circuit, for example, can be operated in optimum condition.

Thus, in the prior art semiconductor integrated circuit, the desired duty ratio is obtained by externally controlling the bias level (VINB) and thereby compensating for the variation of the duty ratio of the output voltage.

In semiconductor integrated circuits such as described above, inductor peaking is sometimes used to increase the band of the circuit, but providing an inductor within a semiconductor chip (IC) increases chip area and hence the cost. To avoid this, a DC voltage (DC bias) is applied as the second differential input signal VINB and its bias level is controlled to vary the duty, In this case, however, the gain of the differential amplifier is almost reduced by one-half compared with the case when complementary signals are applied as the differential input signals VIN and VINB.

The embodiments of the semiconductor integrated circuit and optical transmitter module of the present invention will be described in detail below with reference to drawings.

Figure 4:
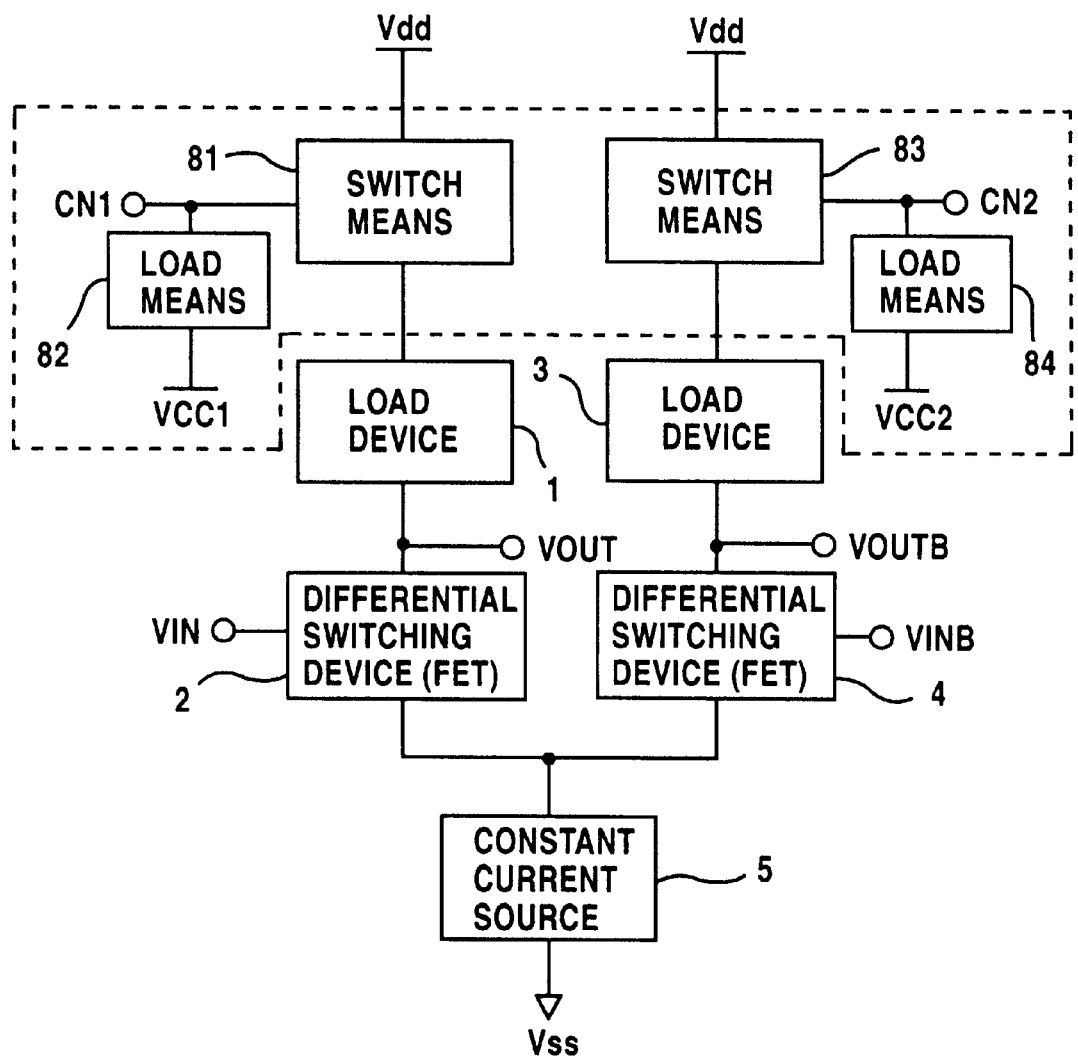
FIG. 4 is a circuit diagram showing the basic functional configuration of a semiconductor integrated circuit (differential circuit) according to the present invention.

FIG. 4 is a circuit diagram showing the basic functional configuration of a semiconductor integrated circuit (differential circuit) according to the present invention. VIN and VINB are differential input signals (input voltages), and VOUT and /VOUT are complementary output signals (output voltages).

In FIG. 4, reference sign Vdd is a first power supply line for supplying a supply voltage, for example, of 0 volt, and Vss is a second power supply line for supplying a supply voltage, for example, of −5.2 volts. Further, reference numerals 1 and 3 are load devices, 2 and 4 are switching FETs (for example, GaAs FETs), and 5 is a constant current source. Furthermore, reference numerals 81 and 83 are switch means (for example, GaAs FETs), 82 and 84 are load means, and CN1 and CN2 are control signals.

As is apparent from the comparison between the semiconductor integrated circuit of FIG. 4 and the prior art semiconductor integrated circuit of FIG. 1, the semiconductor integrated circuit of the present invention includes the switch means 81 and 83 which are inserted between the first power supply line (high voltage supply line) Vdd and the load devices 1 and 3 of the differential circuit, respectively. Further, the control signals CN1 and CN2 are supplied to the control terminals of the switch means 81 and 83, respectively, and the load means 82 and 84 are connected to the respective control terminals, The other ends of the load means 82 and 84 (the ends not connected to the control terminals of the switch means 81 and 83) are connected to power supply lines Vcc1 and Vcc2, respectively. Also, the load means 82 and 84 are constructed so that their impedance values can be changed or set arbitrarily to change the gain and band (operating frequency band) of all or part of the semiconductor integrated circuit. Here, the power supply lines Vcc1 and Vcc2, to which the other ends of the load means 82 and 84 are connected, are, for example, the high voltage supply line Vdd. The semiconductor integrated circuit with the illustrated configuration is capable of varying the DC level of the output voltage VOUT (/VOUT) by applying arbitrary bias (CN1, CN2) to the control terminals of the switch means 81 and 83.

Figure 5:
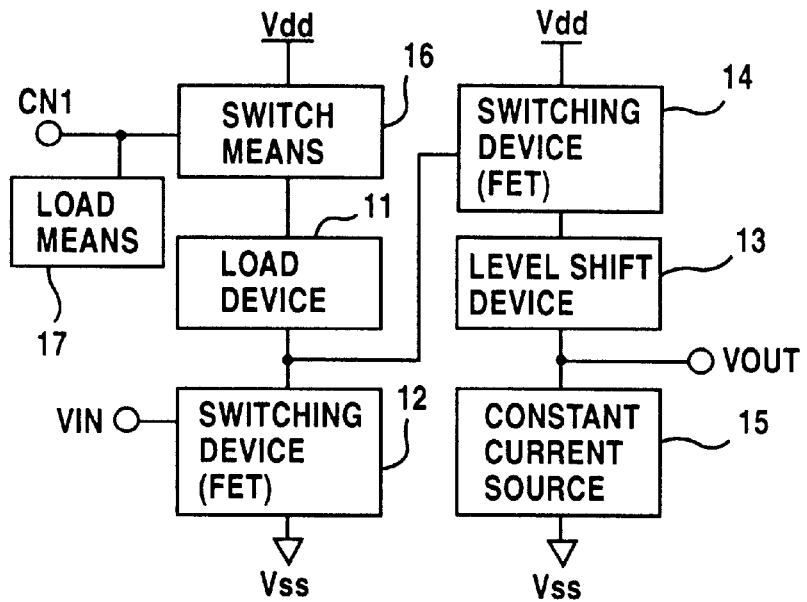
FIG. 5 is a circuit diagram showing the basic functional configuration of a semiconductor integrated circuit (BFL circuit) according to the present invention.

FIG. 5 is a circuit diagram showing the basic functional configuration of a semiconductor integrated circuit (buffered FET logic (BFL) circuit) according to the present invention. In the figure, reference numeral 11 is a load device, 12 and 14 are switching devices (FETs), 13 is a level shift device, 15 is a constant current source, 16 is a switch means, and 17 is a load means.

As shown in FIG. 5, in the BFL circuit to which the present invention is applied, the switch means 16, the load device 11, and the switching device 12 are connected in series between the first power supply line (Vdd) and the second power supply line (Vss). An input voltage VIN is supplied to the control terminal of the switching device 12, and a control signal CN1 is supplied to the switch means 16 at the control terminal thereof which is connected to the load means 17.

A signal taken from the node between the load device 11 and the switching device 12 is supplied to the control terminal of the other switching device (the second switching device) 14. The switching device 14, the level shift device 13, and the constant current source 15 are connected in series between the first power supply line (Vdd) and the second power supply line (VSS), and an output signal (output voltage) VOUT is taken from the node between the level shift device 13 and the constant current source 15. The band, gain, and output voltage of the circuit are controlled by the control signal CN1 and the impedance of the load means 17.

Figure 6:
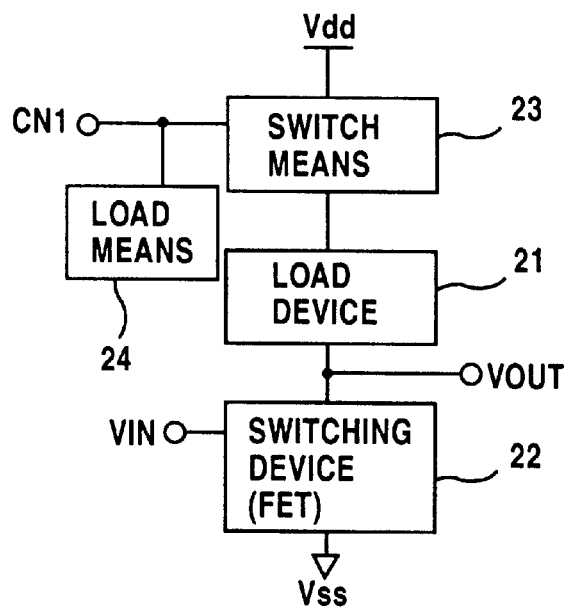
FIG. 6 is a circuit diagram showing the basic functional configuration of a semiconductor integrated circuit (DCFL circuit) according to the present invention.

FIG. 6 is a circuit diagram showing the basic functional configuration of a semiconductor integrated circuit (direct-coupled FET logic (DCPL) circuit) according to the present invention. In the figure, reference numeral 21 is a load device, 22 is a switching device (FET), 23 is a switch means, and 24 is a load means.

As shown in FIG. 6, in the DCFL circuit to which the present invention is applied, the switch means 23, the load device 21, and the switching device 22 are connected in series between the first power supply line (Vdd) and the second power supply line (Vss). An input voltage VIN is supplied to the control terminal of the switching device 22, and a control signal CN1 is supplied to the switch means 23 at the control terminal thereof which is connected to the load means 24. An output signal VOUT is taken from the node between the load device 21 and the switching device 22. The band, gain, and output voltage of the circuit are controlled by the control signal CN1 and the impedance of the load means 24.

As shown in FIGS. 5 and 6, the present invention can be applied not only to the SCFL circuit but also to other types of circuit such as the BFL circuit and DCFL circuit. More specifically, since the semiconductor integrated circuit of the present invention, unlike the prior art configuration, allows the provision of the duty varying control terminal independently of the signal input terminal, as can be seen from FIGS. 5 and 6, the duty varying function can be easily implemented not only in the differential circuit (SCFL circuit) but also in other basic circuits (such as the BFL circuit and DCFL circuit) in which the implementation of such a function has been difficult.

Figure 7:
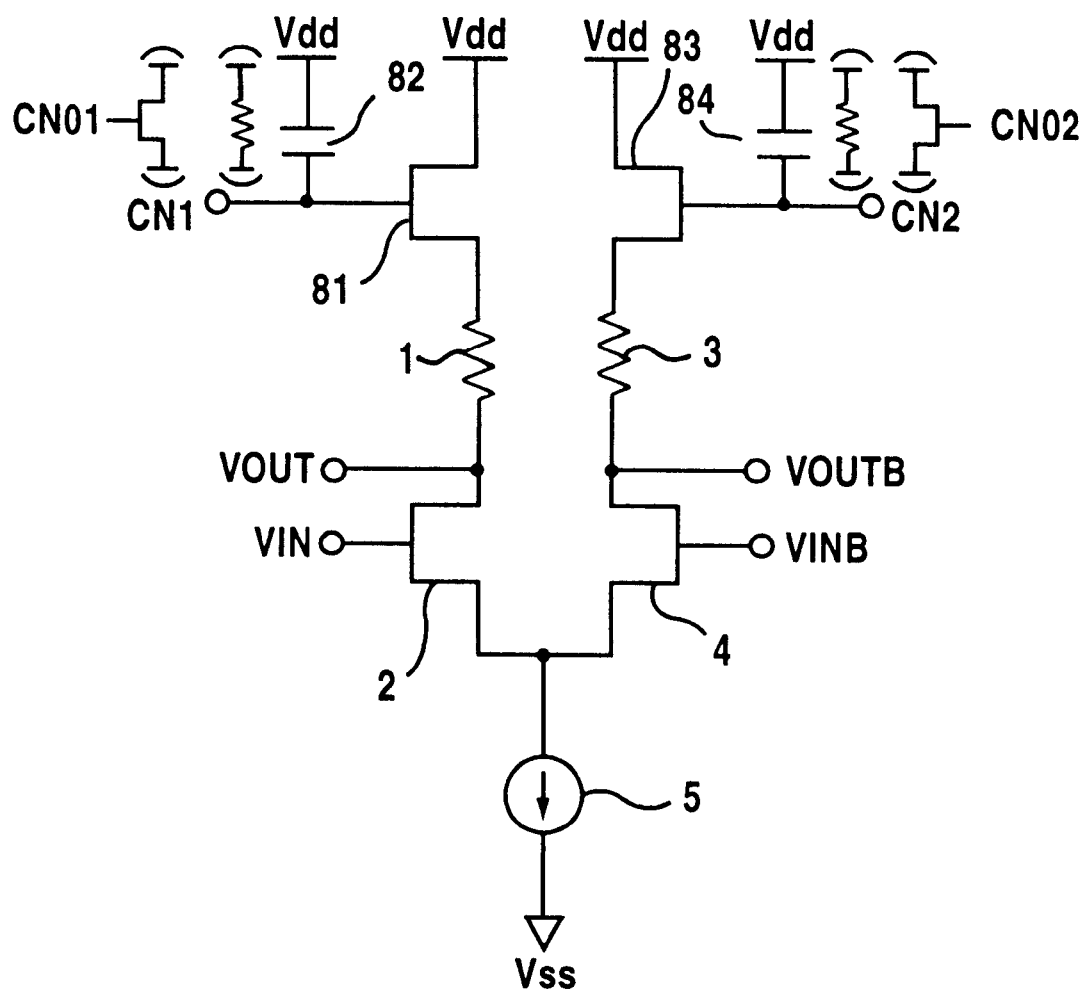
FIG. 7 is a circuit diagram showing a first embodiment of the semiconductor integrated circuit of the present invention.

FIG. 7 is a circuit diagram showing a first embodiment of the semiconductor integrated circuit of the present invention.

As is apparent from the comparison with FIG. 4, the first embodiment shown in FIG. 7 uses resistors for the load devices 1 and 3, FETs for the differential switching devices 2 and 4, FETs for the switch means 81 and 82, capacitors for the load means 82 and 84, and the high voltage supply line Vdd for the power supply lines Vcc1 and Vcc2. In this embodiment, the gain and band of the semiconductor integrated circuit (SCFL circuit) can be varied by varying the capacitance values of the load capacitors (capacitive loads) 82 and 84. Here, the load means 82 and 84 are not limited to the capacitors (load capacitors), but can be constructed using resistors or transistors (FETs whose gates are coupled to control signals CN01 and CN02, respectively). As the transistors, either depletion-mode FETs or enhancement-mode FETs can be chosen for use according to the signals applied to the gates, except the configuration where the type of transistor to be used is specified (depletion-mode FET 21 in FIG. 11).

Figure 8:
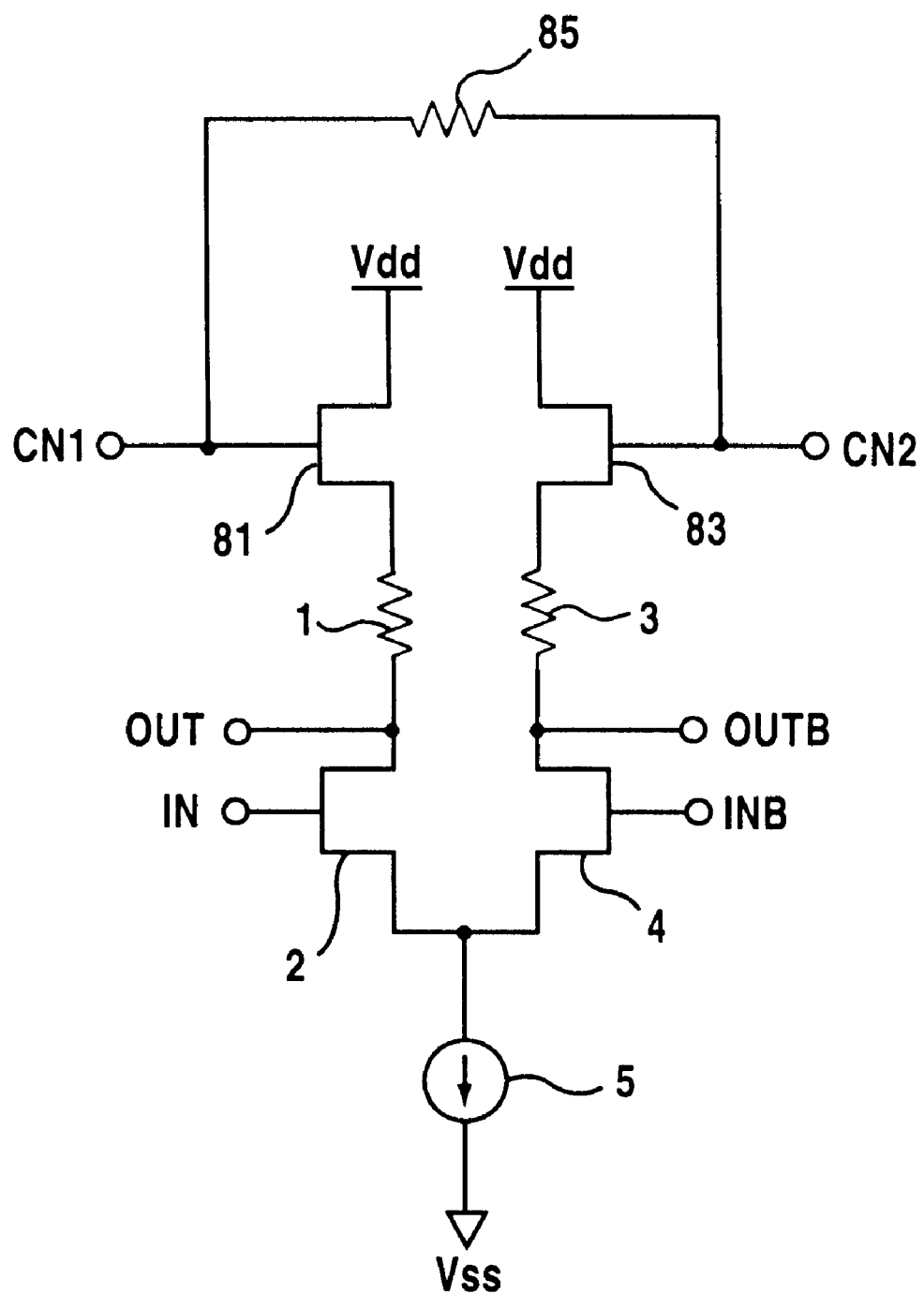
FIG. 8 is a circuit diagram showing a second embodiment of the semiconductor integrated circuit of the present invention.

FIG. 8 is a circuit diagram showing a second embodiment of the semiconductor integrated circuit of the present invention. In the figure, reference numeral 85 indicates a resistor as a load means.

In the second embodiment shown in FIG. 8, as can be seen from the comparison with the first embodiment in FIG. 7, the load capacitors (load means) 82 and 84 are replaced by one resistor 85 via which the control electrodes (gates) of the switch means 81 and 83 are connected.

Figure 9:
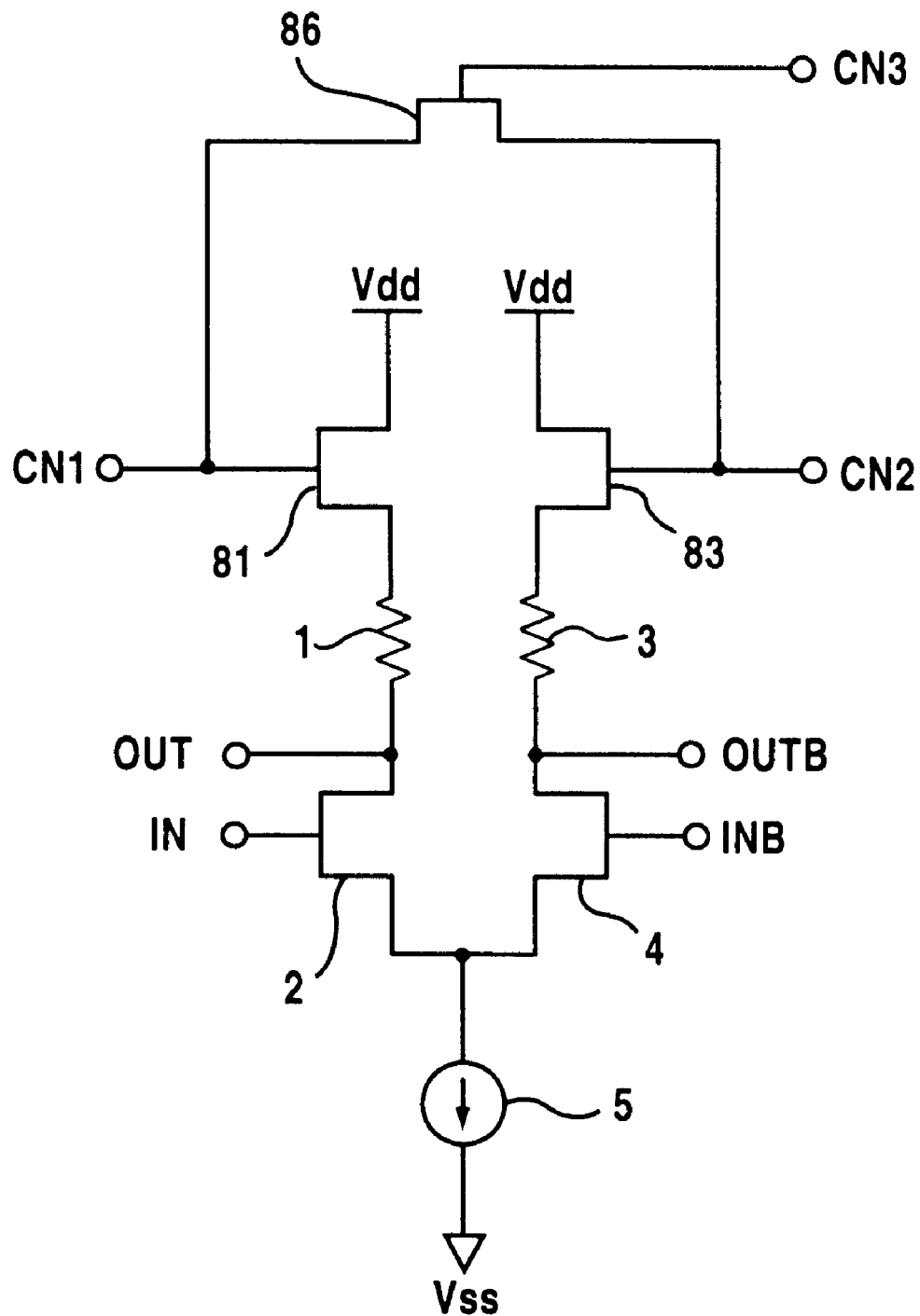
FIG. 9 is a circuit diagram showing a third embodiment of the semiconductor integrated circuit of the present invention.

FIG. 9 is a circuit diagram showing a third embodiment of the semiconductor integrated circuit of the present invention. In the figure, reference numeral 86 indicates an FET as a load means.

In the third embodiment shown in FIG. 9, as can be seen from the comparison with the second embodiment in FIG. 8, the transistor (FET) 86 is provided in place of the resistor 85. A control signal CN3 is supplied to the control electrode (gate) of the transistor 86; with this control signal CN3, the load by the transistor 86 is controlled. More specifically, the control signal CN3 is controlled externally to vary the impedance of the transistor 86 and thereby adjust the gain and band (operating frequency band) of the circuit.

Figure 10:
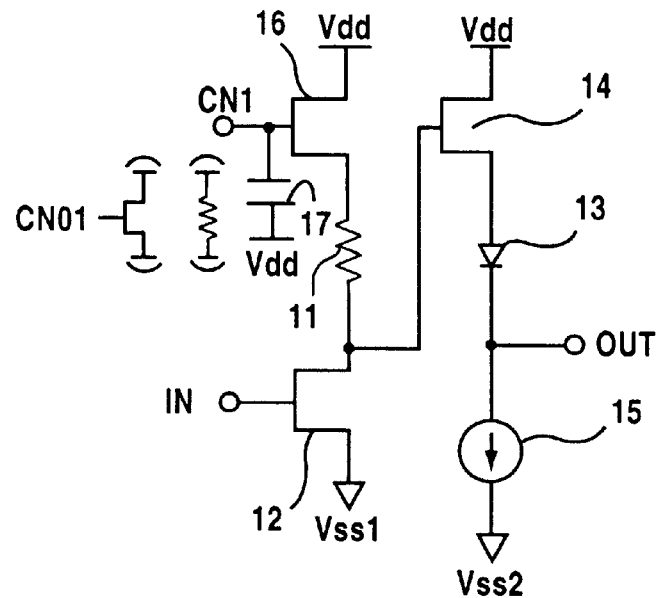
FIG. 10 is a circuit diagram showing a fourth embodiment of the semiconductor integrated circuit of the present invention.

FIG. 10 is a circuit diagram showing a fourth embodiment (BFL circuit) of the semiconductor integrated circuit of the present invention.

As is apparent from the comparison with FIG. 5, the fourth embodiment shown in FIG. 10 uses a resistor for the load device 11, FETs for the switching devices 2, 4 and the switch means 16, a capacitor for the load means 17, and a diode for the level shift means 13. In this embodiment, the gain and band of the semiconductor integrated circuit (BFL circuit) can be varied by varying the capacitance value of the load capacitor 17. Here, the load means 17 is not limited to the capacitor, but can be constructed using a transistor (FET) whose gate is coupled to the control signal CN01. It is also possible to use multiple stages of diodes as the level shift means 13.

Figure 11:
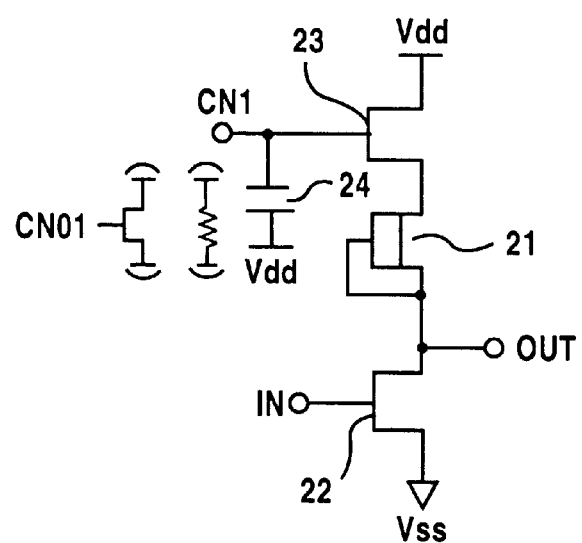
FIG. 11 is a circuit diagram showing a fifth embodiment of the semiconductor integrated circuit of the present invention.

FIG. 11 is a circuit diagram showing a fifth embodiment (DCFL circuit) of the semiconductor integrated circuit of the present invention.

As is apparent from the comparison with FIG. 6, the fifth embodiment shown in FIG. 11 uses an FET (depletion-mode FET) for the load device 21, FETs for the switching device 22 and the switch means 23, and a capacitor for the load means 24. In this embodiment, the gain and band of the semiconductor integrated circuit (DCFL circuit) can be varied by varying the capacitance value of the load capacitor 24. Here, the load means 24 is not limited to the capacitor, but can be constructed using a resistor or a transistor (FET) whose gate is coupled to the control signal CN01.

Figure 12:
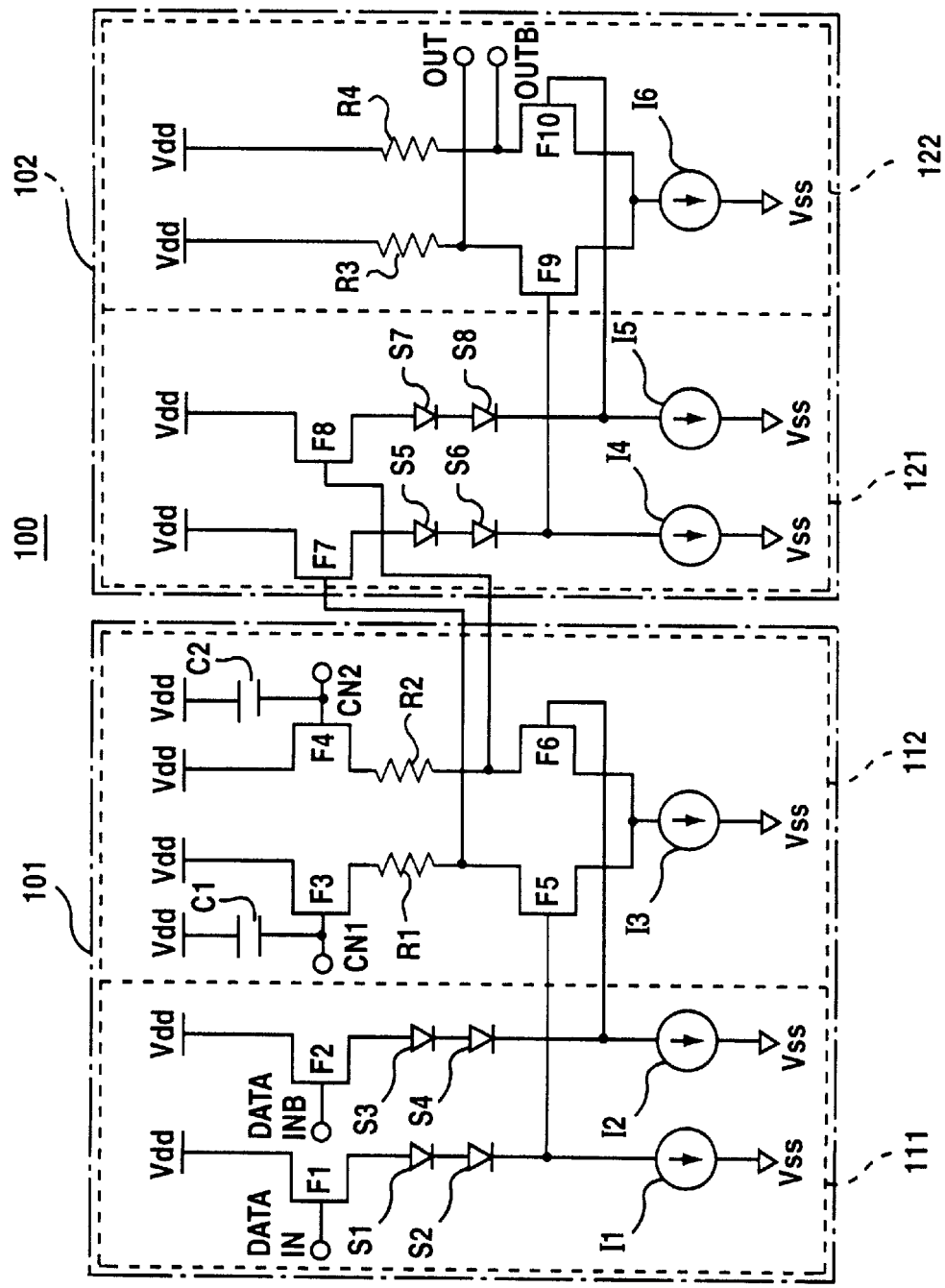
FIG. 12 is a circuit diagram showing one example of a semiconductor integrated circuit consisting of the circuit of the present invention and the circuit of the prior art connected in a two-stage cascade.
Figure 13:
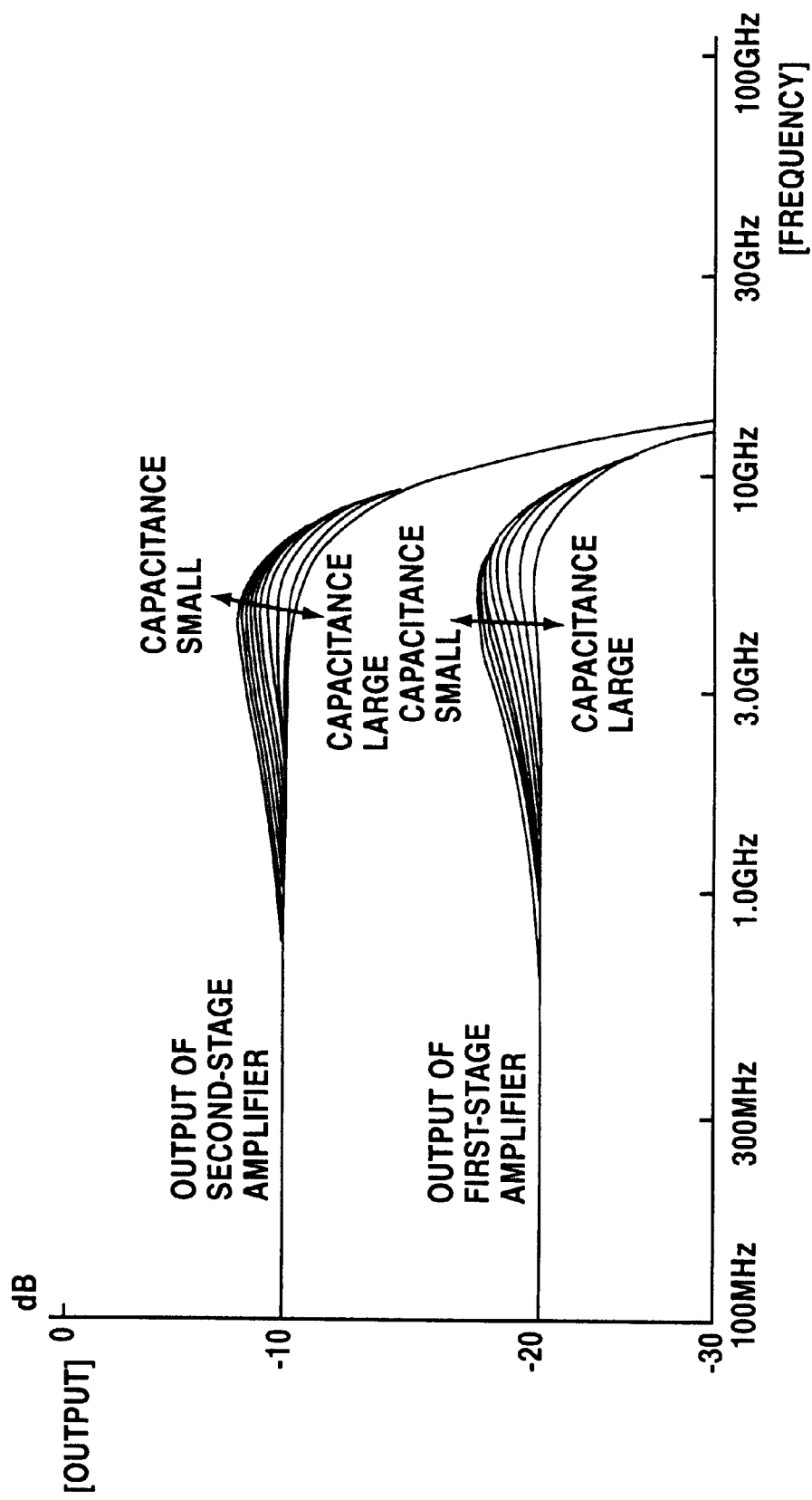
FIG. 13 is a diagram showing simulation results (frequency characteristics) for the semiconductor integrated circuit of FIG. 12.

FIG. 12 is a circuit diagram showing a semiconductor integrated circuit consisting of the circuit of the present invention and the circuit of the prior art connected in a two-stage cascade. FIG. 13 is a diagram showing simulation results (frequency characteristics) for the semiconductor integrated circuit of FIG. 12. The circuit 100 shown in FIG. 12 corresponds to an amplifier block in a driver IC (301) in an optical transmitter module 300 as will be described later, and consists of two amplifier stages connected in cascade (two-stage cascade), an amplifier circuit 101 at the first stage, to which the present invention is applied, and an amplifier circuit 102 of the prior known configuration at the second stage.

As shown in FIG. 12, the first-stage amplifier circuit 101 comprises a level shift block 111, consisting of transistors (FETs) F1 and F2, diodes S1 to S4, and current sources I1 and I2, and a differential amplifier block 112 which corresponds to the circuit previously described with reference to FIG. 7. The second-stage amplifier circuit 102 comprises a level shift block 121, consisting of transistors (FETs) F7 and F8, diodes S5 to S8, and current sources I4 and I5, and a differential amplifier block 122, consisting of transistors F9 and F10, resistors R3 and R4, and a current source I6. Here, as can be seen from the comparison between FIG. 12 and FIG. 7, transistors F3, F4, F5, and F6 in the differential amplifier block 112 correspond to the transistors 81, 83, 2, and 4 in FIG. 7, resistors R1 and R2 correspond to the resistors 1 and 3 in FIG. 7, capacitors C1 and C2 correspond to the capacitors 82 and 84 in FIG. 7, and the current source I3 corresponds to the current source 5 in FIG. 7. By varying the values of the capacitors C1 and C2 in the differential amplifier block 112 of the first-stage amplifier circuit 101, the gain and band (frequency characteristic) of the circuit can be varied as shown in the simulation results of FIG. 13. When the load means (capacitive loads 82 and 84) is constructed using one resistor 85, as shown in FIG. 8, a small load capacitance value ("CAPACITANCE SMALL" in FIG. 13) corresponds to a small resistance value of the resistor 85.

Figure 14:
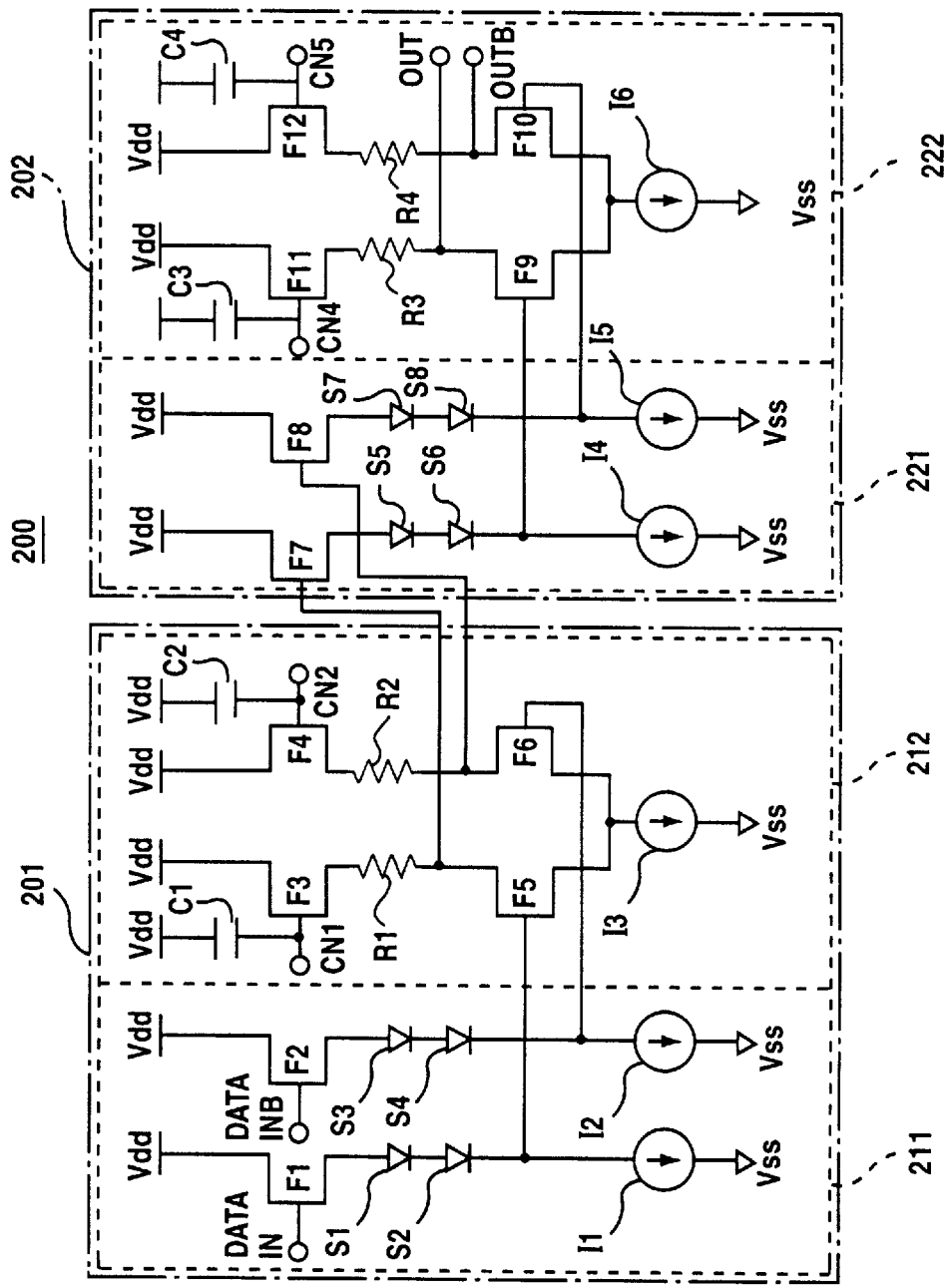
FIG. 14 is a circuit diagram showing one example of a semiconductor integrated circuit consisting of the circuit of the present invention at each of two stages connected in cascade.

FIG. 13 showed the simulation results when the circuit of the present invention was used as the first-stage amplifier circuit 101 and the prior known circuit as the second-stage amplifier circuit 102; by contrast, when the amplifier circuit of the present invention is used at the second stage as well as at the first stage, as shown in FIG. 14, the degree of change (the gain and band adjustable range) further increases.

In this way, in the case of a multi-stage amplifier configuration, when the amplifier circuit to which the present invention is applied is used at the front stage (at any one stage), not only the effect equivalent to the method capable of varying the duty can be obtained, but also the gain of the differential amplifier can be almost doubled compared with the prior known configuration which uses a DC bias as the second differential input signal.

Here, when the control signals CN1 and CN2 in the differential amplifier block 112 are denoted by V1 and V2, respectively, the pinch-off voltage (threshold voltage) of the transistors F3 and F4 by Vt, the gate-source voltage at switch on of the transistors F3 and F4 by Von, the current flowing in the current source I3 by I, and the value of the load devices (resistors) R1 and R2 by R, the output voltages (VOUT and VOUTB) at OUT and OUTB are respectively expressed by the following equations.

$VOUTH = Vdd - (V1 + Vt)$ $VOUTL = Vdd - (V1 + Von + I \times R)$ $VOUTBH = Vdd - (V2 + Vt)$ $VOUTBL = Vdd - (V2 + Von + I \times R)$ where VOUTH indicates the high level "H" of the output voltage VOUT, VOUTL the low level "L" of the output voltage VOUT, VOUTBH the high level "H" of the complementary output voltage VOUTB, and VOUTBL the low level "L" of the complementary output voltage VOUTB.

As can be seen from the above equations, by arbitrarily setting the voltages V1 and V2 of the control signals CN1 and CN2, the signal levels VOUT and VOUTB of the complementary outputs can be varied independently. This means that when a differential amplifier is connected at the following stage, its input levels can be varied arbitrarily; accordingly, the duty varying circuit such as described in connection with the prior art can be constructed while allowing signals to be input to the two input terminals.

FIG. 14 is a circuit diagram showing one example of the semiconductor circuit consisting of the circuit of the present invention at each of the two stages connected in cascade. The circuit 200 of FIG. 14, like the circuit 100 of FIG. 12, corresponds to the amplifier block in the driver IC 301 used in the optical transmitter module 300. The circuit 200 of FIG. 14 consists of an amplifier circuit 201 at the first stage, to which the present invention is applied, and an amplifier circuit 202 at the second stage, to which the present invention is applied, the two stages being connected in cascade (two-stage cascade).

As shown in FIG. 14, the first-stage amplifier circuit 201 and the second-stage amplifier circuit 202 are identical in configuration, and each corresponds to the first-stage amplifier circuit 101 earlier described with reference to FIG. 12. That is, in FIG. 14, the only difference from FIG. 12 lies in the configuration of the differential amplifier block 222 of the second-stage amplifier 202, and the level shift block 211 and differential amplifier block 212 of the first-stage amplifier circuit 201 and the level shift block 221 of the second-stage amplifier circuit 202 in FIG. 14 are the same in configuration as the level shift block 111 and differential amplifier block 112 of the first-stage amplifier circuit 101 and the level shift block 121 of the second-stage amplifier circuit 102 in FIG. 12. As shown in FIG. 14, in the differential amplifier block 222 of the second-stage amplifier circuit 202, transistors (switch means) F11 and F12 are inserted between the high voltage supply line (first power supply line) Vdd and the resistors (load devices) R3 and R4, respectively, and control signals CN4 and CN5 are supplied to the gates of the transistors F11 and F12, which gates are connected to the capacitors (load means) C3 and C4.

The circuit shown in FIG. 14 is configured so that the gain and band of the circuit are controlled not only by the control signals CN1 and CN2 but also by the control signals CN4 and CN5.

Figure 15:
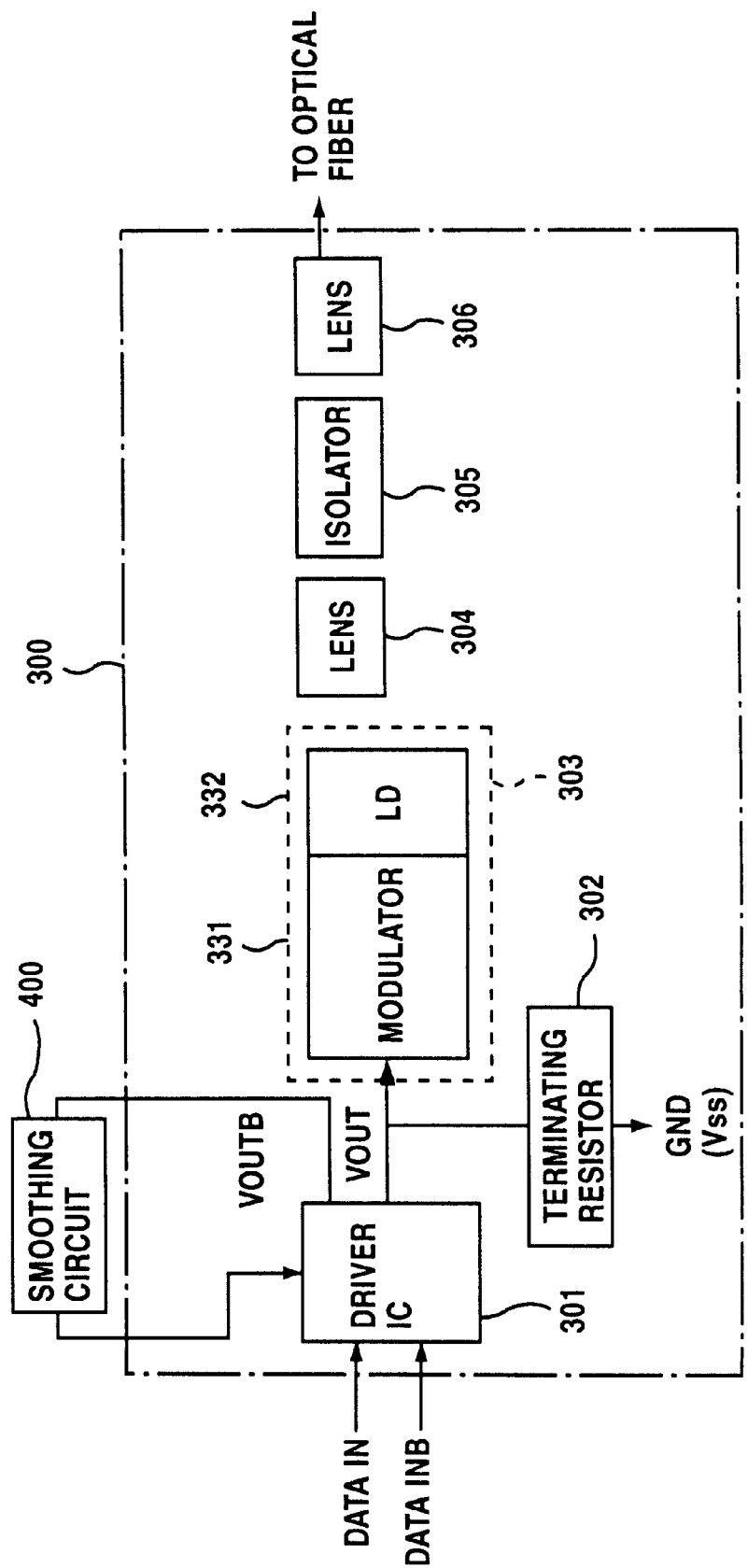
FIG. 15 is a diagram showing schematically the general configuration of an optical transmitter module where the semiconductor integrated circuit of the present invention is applied.

FIG. 15 is a diagram showing schematically the general configuration of the optical transmitter module 300 where the semiconductor integrated circuit of the present invention is applied. In FIG. 15, reference numeral 301 is the driver IC, 302 is a terminating resistor, 303 is a laser diode with a built-in modulator, consisting of a modulator block 331 and a laser diode block 332, 304 and 306 are lenses, 305 is an isolator, and 400 is a smoothing circuit.

As shown in FIG. 15, the optical transmitter module 300 receives complementary input signals DATA IN and DATA INB (VIN and VINB) and outputs laser light modulated with the input signal for transmission through an optical fiber, and comprises the driver IC 301, terminating resistor 302, laser diode 303 with a built-in modulator, and optics (lenses 304, 306 and isolator 305).

The output signal VOUT of the driver IC 301 is supplied to the modulator block 331 and, at the same time, is grounded (GND: Vss) via the terminating resistor 302. The complementary output signal VOUTB of the driver IC 301 is smoothed by the smoothing circuit 400 provided external to the optical transmitter module 300, and the resulting DC signal is fed back to the driver IC 301. Thus the driver IC 301 can deliver the output signal VOUT by automatically performing duty compensation.

Figure 16:
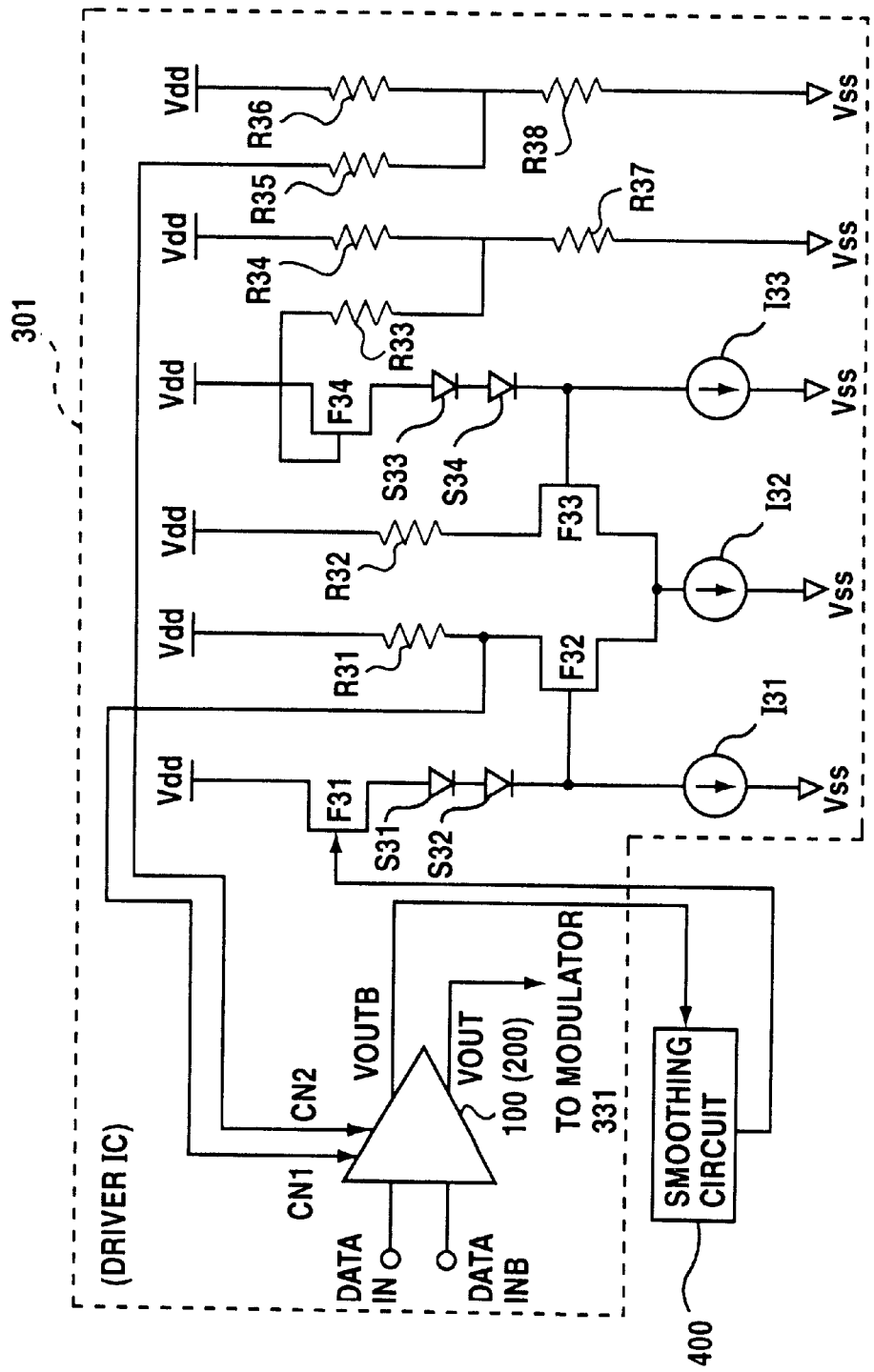
FIG. 16 is a circuit diagram showing one configurational example of a driver IC (semiconductor integrated circuit) used in the optical transmitter module of FIG. 15.

FIG. 16 is a circuit diagram showing one configurational example of the driver IC (semiconductor integrated circuit) used in the optical transmitter module of FIG. 15.

As shown in FIG. 16, the driver IC 301 comprises the amplifier circuit 100 shown in FIG. 12 (or the amplifier circuit 200 shown in FIG. 14), a plurality of transistors F31 to F34, resistors R31 to R38, diodes S31 to S34, and current sources I31 to I33. The output signal VOUT of the amplifier circuit 100 (200). is supplied to the modulator block 331, while the complementary output signal is supplied to the smoothing circuit 400. The smoothing circuit 400 comprises, for example, a capacitor and a resistor, and smooths the complementary output signal VOUTB and supplies the resulting DC signal to the gate of the transistor F31.

More specifically, as shown in FIGS. 12 and 16, the control signals CN1 and CN2 supplied to the gates of the transistors F3 and F4 (switch means 81 and 83) are generated by the driver IC 301 in accordance with the DC signal produced by smoothing the complementary output signal VOUTB in the smoothing circuit 400.

The above-described embodiments illustrate only examples of circuits where the present invention is applied, and it will be appreciated that the circuit configuration can be modified in various ways.

As described in detail above, the present invention is effective in increasing the gain and band of the circuit. Furthermore, since the duty of the output can be varied without compromising the gain of the circuit, it becomes possible to reduce the number of amplifier stages, reducing the overall power consumption and chip area of the circuit. Moreover, the duty varying function can be implemented in such circuits where the incorporation of the function has been difficult with the prior known configuration.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor integrated circuit having a first load device and a first switching device connected in series between a first power supply line and a second power supply line, a control terminal of said first switching device being supplied with an input signal, comprising:

a first switch unit connected between said first load device and said first power supply line, a control terminal of said first switch unit being supplied with a first control signal; and a first load unit connected to the control terminal of said first switch unit, an impedance of said first load unit being set at or varied to an arbitrary value, wherein a band, a gain, and an output voltage of said semiconductor integrated circuit are controlled by said first control signal and the impedance of said first load unit.

2. A semiconductor integrated circuit as claimed in claim 1, wherein said first load unit is a capacitor, and said load capacitor is connected between said first power supply line and the control terminal of said first switch unit.

3. A semiconductor integrated circuit as claimed in claim 1, wherein said first load unit is a resistor, and said load resistor is connected between said first power supply line and the control terminal of said first switch unit.

4. A semiconductor integrated circuit as claimed in claim 1, wherein said first load unit is a transistor having a control terminal supplied with a control signal, and said load transistor is connected between said first power supply line and the control terminal of said first switch unit.

5. A semiconductor integrated circuit as claimed in claim 1, wherein said semiconductor integrated circuit is a direct-coupled FET logic circuit, and an output signal is taken from a node between said first load device and said first switching device.

6. A semiconductor integrated circuit as claimed in claim 1, wherein said semiconductor integrated circuit is a buffered FET logic circuit, and said buffered FET logic circuit further comprises:

a second switching device having a control terminal supplied with a signal taken from a node between said first load device and said first switching device;

a level shift device connected to said second switching device; and a constant current source connected to said level shift device, wherein an output signal is taken from a node between said level shift device and said constant current source.

7. A semiconductor integrated circuit as claimed in claim 6, wherein said second switching device, said level shift device, and said constant current source are connected in series between said first power supply line and said second power supply line.

8. A semiconductor integrated circuit as claimed in claim 6, wherein said level shift device includes at least one diode unit.

9. A semiconductor integrated circuit as claimed in claim 1, wherein said semiconductor integrated circuit is a source-coupled FET logic circuit, and said source-coupled FET logic circuit further comprises:

a second switch unit, a second load device, and a second switching device, connected in series between said first power supply line and said second power supply line, and wherein:

a complementary input signal complementary to said input signal is supplied to the control terminal of said second switching device;

a second control signal is supplied to the control terminal of said second switch unit, the control terminal of said second switch unit being coupled to a second load unit whose impedance is set at or varied to an arbitrary value;

an output signal is taken from a node between said first load device and said first switching device;

a complementary output signal complementary to the output signal is taken from a node between said second load device and said second switching device; and a band, a gain, and an output voltage of said semiconductor integrated circuit are controlled by the first and second control signals and the impedances of said first and second load units.

10. A semiconductor integrated circuit as claimed is in claim 9, wherein said first and second switching devices are connected to said second power supply line via a constant current source.

11. A semiconductor integrated circuit as claimed in claim 9, wherein each of said first and second load units is a capacitor, and said first load capacitor is connected between said first power supply line and the control terminal of said first switch unit, while said second load capacitor is connected between said first power supply line and the control terminal of said second switch unit.

12. A semiconductor integrated circuit as claimed in claim 9, wherein each of said first and second load units is a resistor, and said first load resistor is connected between said first power supply line and the control terminal of said first switch unit, while said second load resistor is connected between said first power supply line and the control terminal of said second switch unit.

13. A semiconductor integrated circuit as claimed in claim 9, wherein each of said first and second load units is a transistor having a control terminal supplied with a control signal, and said first load transistor is connected between said first power supply line and the control terminal of said first switch unit, while said second load transistor is connected between said first power supply line and the control terminal of said second switch unit.

14. A semiconductor integrated circuit as claimed in claim 9, wherein said first and second load units are constructed together as one resistor.

15. A semiconductor integrated circuit as claimed in claim 9, wherein said first and second load units are constructed together as one transistor having a control terminal supplied with a control signal.

16. A semiconductor integrated circuit comprising multiple stages of amplifier circuits, at least one of said amplifier circuits having a first load device and a first switching device connected in series between a first power supply line and a second power supply line, a control terminal of said first switching device being supplied with an input signal, wherein said at least one of said amplifier circuits comprises:

a first switch unit connected between said first load device and said first power supply line, a control terminal of said first switch unit being supplied with a first control signal; and a first load unit connected to the control terminal of said first switch unit, an impedance of said first load unit being set at or varied to an arbitrary value, wherein a band, a gain, and an output voltage of said semiconductor integrated circuit are controlled by said first control signal and the impedance of said first load unit.

17. An optical transmitter module comprising a driver integrated circuit for accepting input signals and for amplifying the input signals, a modulator block for accepting an output signal of said driver integrated circuit and for performing modulation using said output signal, a laser diode block for outputting laser light modulated in accordance with the output of said modulator block, and optics for coupling the laser light output from said laser diode block into an optical fiber, said driver integrated circuit comprising a first load device and a first switching device connected in series between a first power supply line and a second power supply line, a control terminal of said first switching device being supplied with an input signal, wherein said driver integrated circuit further comprises:

a first switch unit connected between said first load device and said first power supply line, said first switch unit having a control terminal supplied with a first control signal; and a first load unit connected to the control terminal of said first switch unit, an impedance of said first load unit being set at or varied to an arbitrary value, wherein a band, a gain, and an output voltage of said driver integrated circuit are controlled by the first control signal and the impedance of said first load unit.

18. An optical transmitter module as claimed in claim 17, wherein said first load unit is a capacitor, and said load capacitor is connected between said first power supply line and the control terminal of said first switch unit.

19. An optical transmitter module as claimed in claim 17, wherein said first load unit is a resistor, and said load resistor is connected between said first power supply line and the control terminal of said first switch unit.

20. An optical transmitter module as claimed in claim 17, wherein said first load unit is a transistor having a control terminal supplied with a control signal, and said load transistor is connected between said first power supply line and the control terminal of said first switch unit.

21. An optical transmitter module as claimed in claim 17, wherein said driver integrated circuit is a direct-coupled FET logic circuit, and the output signal is taken from a node between said first load device and said first switching device.

22. An optical transmitter module as claimed in claim 17, wherein said driver integrated circuit is a buffered FET logic circuit, and said buffered FET logic circuit further comprises:

a second switching device having a control terminal supplied with a signal taken from a node between said first load device and said first switching device;

a level shift device connected to said second switching device; and a constant current source connected to said level shift device, wherein an output signal is taken from a node between said level shift device and said constant current source.

23. An optical transmitter module as claimed in claim 22, wherein said second switching device, said level shift device, and said constant current source are connected in series between said first power supply line and said second power supply line.

24. An optical transmitter module as claimed in claim 22, wherein said level shift device includes at least one diode unit.

25. An optical transmitter module as claimed in claim 17, wherein said driver integrated circuit is a source-coupled FET logic circuit, and said source-coupled FET logic circuit further comprises:

a second switch unit, a second load device, and a second switching device, connected in series between said first power supply line and said second power supply line, and wherein:

a complementary input signal complementary to said input signal is supplied to the control terminal of said second switching device;

a second control signal is supplied to the control terminal of said second switch unit, the control terminal of said second switch unit being coupled to a second load unit whose impedance is set at or varied to an arbitrary value;

an output signal is taken from a node between said first load device and said first switching device;

a complementary output signal complementary to the output signal is taken from a node between said second load device and said second switching device; and a band, a gain, and an output voltage of said semiconductor integrated circuit are controlled by the first and second control signals and the impedances of said first and second load units.

26. An optical transmitter module as claimed in claim 25, wherein said first and second switching devices are connected to said second power supply line via a constant current source.

27. An optical transmitter module as claimed in claim 25, wherein each of said first and second load units is a capacitor, and said first load capacitor is connected between said first power supply line and the control terminal of said first switch unit, while said second load capacitor is connected between said first power supply line and the control terminal of said second switch unit.

28. An optical transmitter module as claimed in claim 25, wherein each of said first and second load units is a resistor, and said first load resistor is connected between said first power supply line and the control terminal of said first switch unit, while said second load resistor is connected between said first power supply line and the control terminal of said second switch unit.

29. An optical transmitter module as claimed in claim 25, wherein each of said first and second load units is a transistor having a control terminal supplied with a control signal, and said first load transistor is connected between said first power supply line and the control terminal of said first switch unit, while said second load transistor is connected between said first power supply line and the control terminal of said second switch unit.

30. An optical transmitter module as claimed in claim 25, wherein said first and second load units are constructed together as one resistor.

31. An optical transmitter module as claimed in claim 25, wherein said first and second load units are constructed together as one transistor having a control terminal supplied with a control signal.

32. An optical transmitter module as claimed in claim 25, wherein the complementary output signal is smoothed by a smoothing circuit, and the resulting DC signal is fed back to said driver integrated circuit to generate the first and second control signals, thereby automatically performing duty compensation for the output signal.

33. An optical transmitter module comprising a driver integrated circuit having multiple stages of amplifier circuits for accepting input signals and for amplifying the input signals, a modulator block for accepting an output signal of said driver integrated circuit and for performing modulation using said output signal, a laser diode block for outputting laser light modulated in accordance with the output of said modulator block, and optics for coupling the laser light output from said laser diode block into an optical fiber, at least one of said amplifier circuits having a first load device and a first switching device connected in series between a first power supply line and a second power supply line, a control terminal of said first switching device being supplied with an input signal, wherein said at least one of said amplifier circuits comprises:

a first switch unit connected between said first load device and said first power supply line, said first switch unit having a control terminal supplied with a first control signal; and a first load unit connected to the control terminal of said first switch unit, an impedance of said first load unit being set at or varied to an arbitrary value, wherein a band, a gain, and an output voltage of said driver integrated circuit are controlled by the first control signal and the impedance of said first load unit.

34. An optical transmitter module as claimed in claim 33, wherein said at least one of said amplifier circuits is at the first stage of said multiple stages of amplifier circuits.

* * * * *